(12) United States Patent
Lin et al.

(10) Patent No.: US 12,142,537 B2
(45) Date of Patent: Nov. 12, 2024

(54) DEFECT MEASUREMENT METHOD

(71) Applicant: NATIONAL TSING HUA UNIVERSITY, Hsinchu (TW)

(72) Inventors: Burn-Jeng Lin, Hsinchu (TW); Chrong-Jung Lin, Hsinchu (TW); Ya-Chin King, Hsinchu (TW); Yi-Pei Tsai, Hsinchu (TW)

(73) Assignee: NATIONAL TSING HUA UNIVERSITY, Hsinchu (TW)

( * ) Notice: Subject to any disclaimer, the term of this patent is extended or adjusted under 35 U.S.C. 154(b) by 638 days.

(21) Appl. No.: 17/143,134

(22) Filed: Jan. 6, 2021

(65) Prior Publication Data
US 2021/0159129 A1 May 27, 2021

Related U.S. Application Data

(62) Division of application No. 16/583,283, filed on Sep. 26, 2019, now Pat. No. 11,335,609.

(30) Foreign Application Priority Data

Apr. 3, 2019 (TW) .................................. 108112013

(51) Int. Cl.
*H01L 29/72* (2006.01)
*H01L 21/66* (2006.01)
*H01L 23/58* (2006.01)
*H01L 29/66* (2006.01)
(Continued)

(52) U.S. Cl.
CPC .............. *H01L 22/14* (2013.01); *H01L 22/30* (2013.01); *H01L 29/7831* (2013.01); *H01L 29/785* (2013.01); *H01L 29/788* (2013.01)

(58) Field of Classification Search
CPC .. H01L 29/788; H01L 22/34; H01L 29/66825
See application file for complete search history.

(56) References Cited

U.S. PATENT DOCUMENTS 4,503,519 A * 3/1985 Arakawa ............. H01L 29/7886
365/185.27
5,844,300 A * 12/1998 Alavi ..................... H10B 69/00
257/532
6,313,502 B1 11/2001 Widdershoven
(Continued)

FOREIGN PATENT DOCUMENTS

CN 103715198 A 4/2014
CN 105097864 A 11/2015
(Continued)

*Primary Examiner* — Anthony Ho
*Assistant Examiner* — David J Goodwin
(74) *Attorney, Agent, or Firm* — CKC & Partners Co., LLC (57) ABSTRACT

A micro detector includes a substrate, a fin structure, a floating gate, a sensing gate, a reading gate and an energy sensing film. The fin structure is located on the substrate. The floating gate is located on the substrate, and the floating gate is vertically and crossly arranged with the fin structure. The sensing gate is located at one side of the fin structure. The reading gate is located at the other side of the fin structure. The energy sensing film is located on the sensing gate and is connected with the sensing gate. An induced charge is generated when the energy sensing film is contacted with an external energy source, and the induced charge is stored in the floating gate.

6 Claims, 12 Drawing Sheets

(51) Int. Cl.
*H01L 29/78* (2006.01)
*H01L 29/788* (2006.01)

(56) References Cited

U.S. PATENT DOCUMENTS

| | | | |
|---|---|---|---|
| 6,960,784 B2 * | 11/2005 | Lin | H01L 22/34 |
| | | | 257/288 |
| 7,742,324 B2 | 6/2010 | Juengling | |
| 2003/0098706 A1 * | 5/2003 | Schroeder | H01L 22/34 |
| | | | 257/296 |
| 2006/0166421 A1 | 7/2006 | Kamioka et al. | |
| 2013/0099300 A1 | 4/2013 | Cai et al. | |
| 2013/0307047 A1 | 11/2013 | Sakuma et al. | |
| 2016/0254406 A1 * | 9/2016 | Leisenberger | H01L 29/4916 |
| | | | 257/290 |
| 2017/0345941 A1 * | 11/2017 | Wu | H01L 29/7883 |
| 2020/0176578 A1 | 6/2020 | Jourba et al. | |

FOREIGN PATENT DOCUMENTS

| | | |
|---|---|---|
| CN | 107452744 A | 12/2017 |
| TW | 200941493 A | 10/2009 |
| TW | 201407755 A | 2/2014 |
| TW | 201543616 A | 11/2015 |

* cited by examiner

DEFECT MEASUREMENT METHOD

RELATED APPLICATIONS

The present application is a division of the application Ser. No. 16/583,283, filed on Sep. 26, 2019, which claims priority to Taiwan Application Serial Number 108112013, filed on Apr. 3, 2019, which are herein incorporated by reference.

BACKGROUND

Technical Field

The present disclosure relates to a micro detector and a defect measurement method applied to the micro detector. More particularly, defects generated during a manufacturing process of a wafer of a semiconductor device can be detected immediately through measuring an electrical characteristic of the micro detector.

Description of Related Art

Modern electronic devices are developed toward compact sizes and high performances. Most of the electronic device is made from a semiconductor material. A photolithography process is an important process for determining a critical dimension (CD) of an electronic device. However, it is difficult to reach a dimension under 20 nm by using an ArF laser immersion lithography process. Therefore, a EUV (Extreme Ultraviolet) light lithography technology has become an important technology.

A EUV light is commonly generated by an excitation in plasma having a high temperature and a high density. A high energy EUV light generated from plasma is condensed through the condensing lens, passed through an intermediate focus, reshaped by an illumination system and irradiated to a reflective mask. The EUV light is reflected by the reflective mask and is irradiated to a photoresist through an optical projection system so that a required pattern can be formed.

Many wafer manufacturing companies have invested a lot of sources on developing the EUV light lithography system. However, the EUV light lithography system still have issues such as lacking of suitable source energy, non-uniformity of the coating distribution of the photoresist and lacking of suitable detecting system, etc. Furthermore, the EUV light lithography system will be influenced by a flare effect or a scattered light. In addition, the EUV light lithography system uses reflective optical components to produce a reflective light, therefore, the issues such as the loss of the critical dimension and the surface uniformity is magnified.

The flare effect of the EUV light lithography system is occurred owing to an unwanted scattered light and a roughness surface. The critical dimension is dramatically influenced by the flare effect. Therefore, many optical methods are developed to observe the flare effect.

A method for detecting a diffraction of the EUV light and the flare effect is by using a CSM (Coherent EUV Scattering Microscopy) system. The system uses CCD detector (Charge-Coupled Device detector) to detect the diffraction pattern of the EUV mask, and the defect signals and the level of the flare effect can be detected by observing the diffraction pattern.

Another method uses a mask to define a position between a vertical displacement and a horizontal displacement and contacts. When a pattern is generated, a CD-SEM (Critical Dimension Scanning Electron Microscopy) is used to measure the displacement of the pattern. The level of the flare effect can be estimated by observing the displacement of the pattern.

However, complicated equipment is required to perform the aforementioned optical method. Furthermore, the defect measurement result cannot be instantly and precisely obtained due to its measurement principle.

SUMMARY

According to one aspect of the present disclosure, a micro detector is provided. The micro detector includes a substrate, a fin structure, a floating gate, a sensing gate, a reading gate and an energy sensing film. The fin structure is located on the substrate. The floating gate is located on the substrate, wherein the floating gate is vertically and crossly arranged with the fin structure. The sensing gate is located at one side of the fin structure. The reading gate is located at the other side of the fin structure. The energy sensing film is located on the sensing gate and is connected with the sensing gate. Wherein an induced charge is generated when the energy sensing film is contacted with an external energy source and the induced charge is stored in the floating gate by a coupling effect.

According to another aspect of the present disclosure, a defect measurement method is provided. The defect measurement method is applied to at least one micro detector, wherein the micro detector includes a substrate, a floating gate located on the substrate and a coupling structure coupled with the floating gate, the defect measurement method includes: generating an induced charge by contacting the coupling structure with an external energy source; generating a coupling effect through the coupling structure and storing the induced charge in the floating gate; performing an electrical measurement to the micro detector for obtaining a cut-off voltage of the micro detector; comparing the cut-off voltage with a reference voltage for obtaining an offset value of the cut-off voltage; and calculating a value of the induced charge using the offset value of the cut-off voltage.

DETAILED DESCRIPTION

It is an aspect of the present disclosure to provide a micro detector and a defect measurement method. An electrical measurement method can be used to estimate a distribution of an induced charge, and the defects caused by an external energy source can be estimated by analyzing the distribution.

Figure 1:
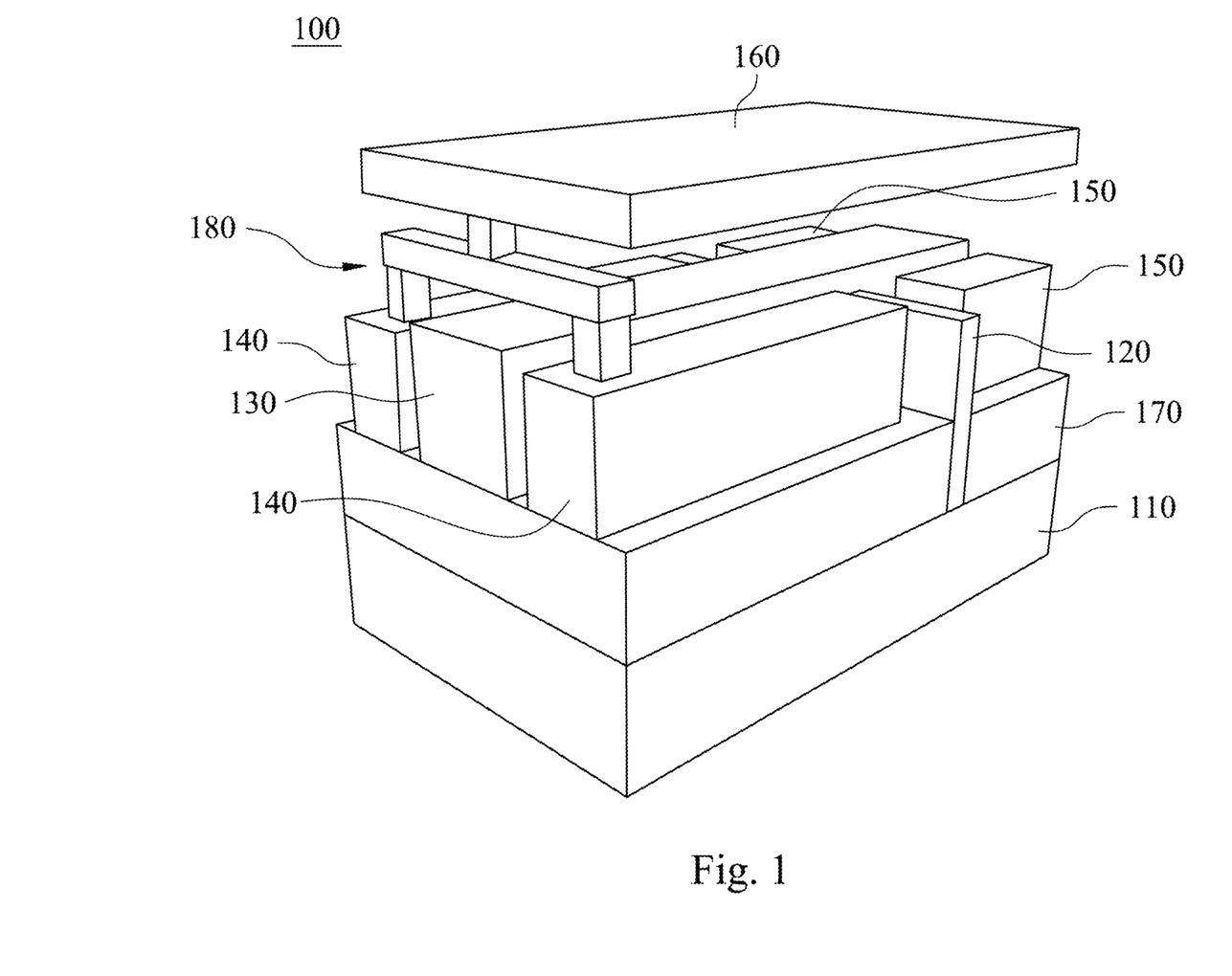
FIG. 1 is a schematic view showing a structure of a micro detector according to one embodiment of the present disclosure.
Figure 2:
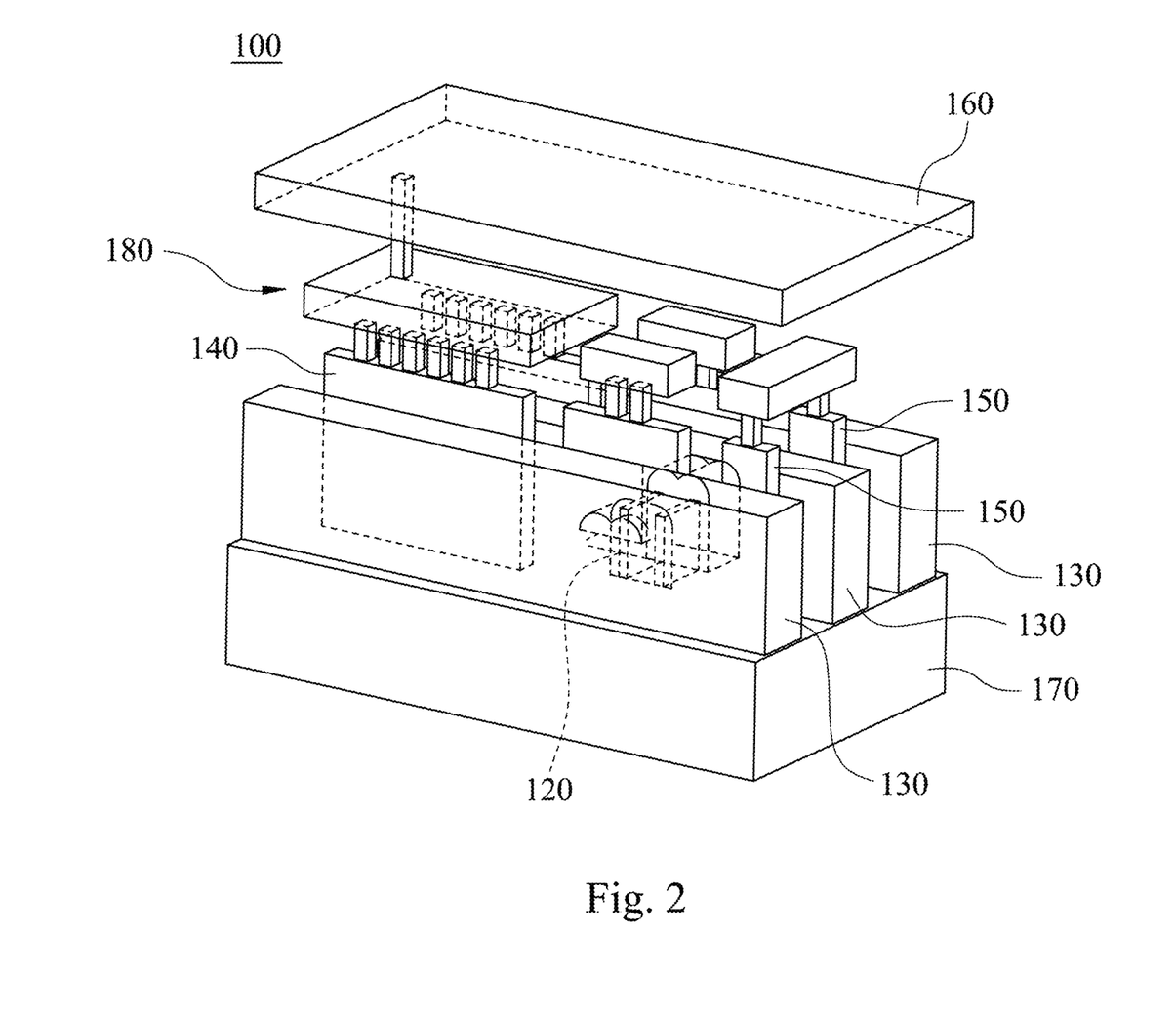
FIG. 2 is a schematic view showing a structure of a micro detector according to another embodiment of the present disclosure.

FIG. 1 is a schematic view showing a structure of a micro detector 100 according to one embodiment of the present disclosure; FIG. 2 is a schematic in view showing a structure of a micro detector 100 according to another embodiment of the present disclosure.

The micro detector 100 includes a substrate 110, a fin structure 120, a floating gate 130, a sensing gate 140, a reading gate 150 and an energy sensing film 160. The fin structure 120 is located on the substrate 110. The floating gate 130 is also located on the substrate 110 and is vertically and crossly arranged with the fin structure 120. The sensing gate 140 is located at one side of the fin structure 120. The reading gate 150 is located at the other side of the fin structure 120. The energy sensing film 160 is located on the sensing gate 140 and is connected with the sensing gate 140. An induced charge is generated when the energy sensing film 160 is contacted with an external energy source, and the induced charge is stored in the floating gate 130 through a coupling effect.

In one embodiment, the micro detector 100 can include a shallow trench isolation layer 170. The shallow trench isolation layer 170 is located on the substrate 110, and the fin structure 120 is disposed through the shallow trench isolation layer 170. In more detail, the fin structure 120 is extended upward from the substrate 110 and is disposed through the shallow trench isolation layer 170. The sensing gate 140 and the reading gate 150 are divided by the fin structure 120 and are located at two opposite sides of the fin structure 120. Furthermore, the shallow trench isolation layer 170 is used to reduce a current leakage. However, another kind of structure may be used to replace the shallow trench isolation layer 170. For example, a SOI layer can be formed on the substrate 110 first, and then the fin structure 120 can be formed on the SOI layer.

The micro detector 100 can further include a connecting contact 180. The energy sensing film 160 connects with the sensing gate 140 through the connecting contact 180. The connecting contact 180 can have a shape of a flat, a column or a dot. The energy sensing film 160 can have a shape of a flat, a palisade or a fork. The energy sensing film 160 can be made of a metal or a photosensitive material. A thickness of the energy sensing film 160 can be from 500 Å to 12000 Å. A sensing effect of the micro detector 100 may be varied with different shapes and thicknesses. Different shapes are generated by different etching ratio, and different thicknesses are generated by different etching times.

The substrate 110 can be made of any proper semiconductor materials, such as Si, Ge, C or another II-VI type or III—V type semiconductors.

The fin structure 120 can be formed on the substrate 110 through an epitaxial growth and a photolithography process. For example, a high aspect ratio of the fin structure 120 can be formed through a selective etching process and a photolithography process. Various kinds of photolithography processes can be used, such as a EUV light lithography process, an X-ray lithography process, etc.

The fin structure 120 can have a shallow width smaller than several nanometers. It should be known that a drain and a source can be defined using a doping process performed to the fin structure 120, thereby forming a field effect transistor (FET) structure. In other word, the micro detector 100 of the present disclosure is formed by applying a FinFET structure.

The micro detector 100 in FIG. 2 has similar structure as the micro detector 100 in FIG. 1, also includes a fin structure 120, a floating gate 130, a sensing gate 140, a reading gate 150, an energy sensing film 160, a shallow trench isolation layer 170 and a connecting contact 180. In the micro detector 100 of FIG. 2, the connecting contact 180 is extended and connected on the sensing gate 140 and the reading gate 150.

Figure 3:
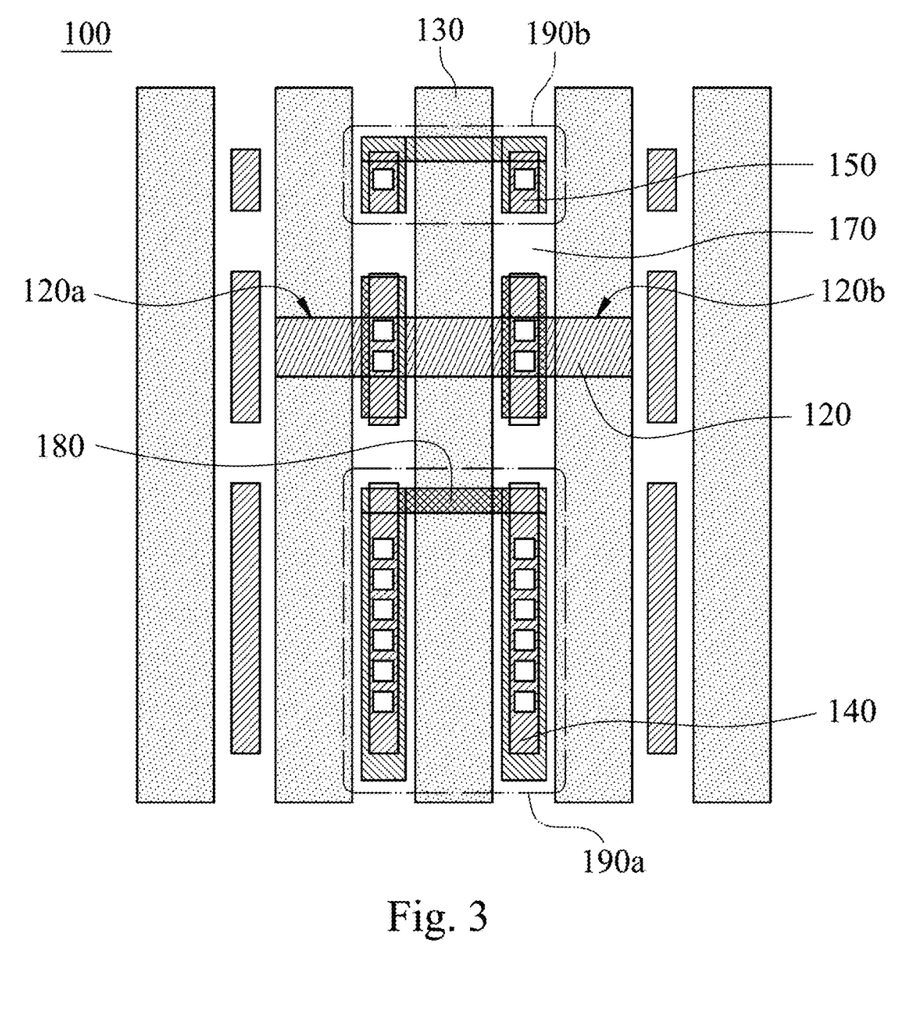
FIG. 3 is a top view of the micro detector of FIG. 2.

FIG. 3 is a top view of the micro detector 100 of FIG. 2. It is shown in FIG. 3 that a drain 120a and a source 120b are formed at two ends of the fin structure 120 of the micro detector 100. In other word, the micro detector 100 of the present disclosure is based on a FinFET structure. However, in another embodiment, the micro detector 100 of the present disclosure can also be based on a planar FET structure. Accordingly, in FIG. 3, the sensing gate 140 and the reading gate 150 can be viewed as a coupling structure, and the coupling structure can be divided into a charge collecting region 190a and a signal reading region 190b. The sensing gate 140 is located in the charge collecting region 190a, and the reading gate 150 is located in the signal reading region 190b.

An operation mechanism of the micro detector 100 is then described. In one embodiment, the micro detector 100 of the present disclosure is used to detect defects generated during a manufacturing process of a wafer of a semiconductor device. The defects commonly are resulted from electrical failures of the semiconductor device. The electrical failures may be resulted from an induced charge generated during a plasma etching process or a flare effect of a EUV light lithography process. First, the induced charge is received by the energy sensing film 160 and is accumulated on the sensing gate 140 through the coupling structure, thereby inducing a high potential difference between the floating gate 130 and the substrate 110. Through a quantum tunneling effect, the induced charge will be accumulated on the floating gate 130. In FIG. 3, the charge collecting region 190a and the signal reading region 190b can be viewed as including a transistor structure respectively. Therefore, in the signal reading region 190b, the reading gate 150 can read a signal. The sensing gate 140 is connected with the energy sensing film 160, and its voltage is coupled with the floating gate 130 through the connecting contact 180. Therefore, an electrical measurement can be performed through the reading gate 150 for obtaining an I-V curve of the transistor structure. Through the I-V curve, a cut-off voltage can be obtained. The cut-off voltage can be used to calculate a value of the induced charge. Therefore, a defect measurement method is provided in the present disclosure. The defect measurement method includes the following steps: generating an induced charge by contacting the coupling structure with an external energy source; generating a coupling effect through the coupling structure and storing the induced charge in the floating gate 130; performing an electrical measurement to the micro detector 100 for obtaining a cut-off voltage of the micro detector 100; comparing the cut-off voltage with a reference voltage for obtaining a offset value of the cut-off voltage; and calculating a value of the induced charge using the offset value of the cut-off voltage. The charge value of the induced charge $Q_{FG}$ can be represented by the following equations: $Q_{FG}=C_T \times \Delta V_T \times CR_{READ}$; wherein $C_T$ is a total capacitance of the floating gate 130, $\Delta V_T$ is the offset value of the cut-off voltage, and $CR_{READ}$ is a couple ratio of the reading gate 150. The aforementioned external energy source can be an electromagnetic wave, an electron beam, a plasma or an ion beam. The electromagnetic wave can include an ultraviolet light, a violet light, an extreme ultraviolet light, a visible light or an infrared light. In other word, the micro detector 100 of the present disclosure can be used to measure defects and is applicable to any kinds of external energy source that can generate induced charge while being contacted with the energy sensing film 160.

Figure 4:
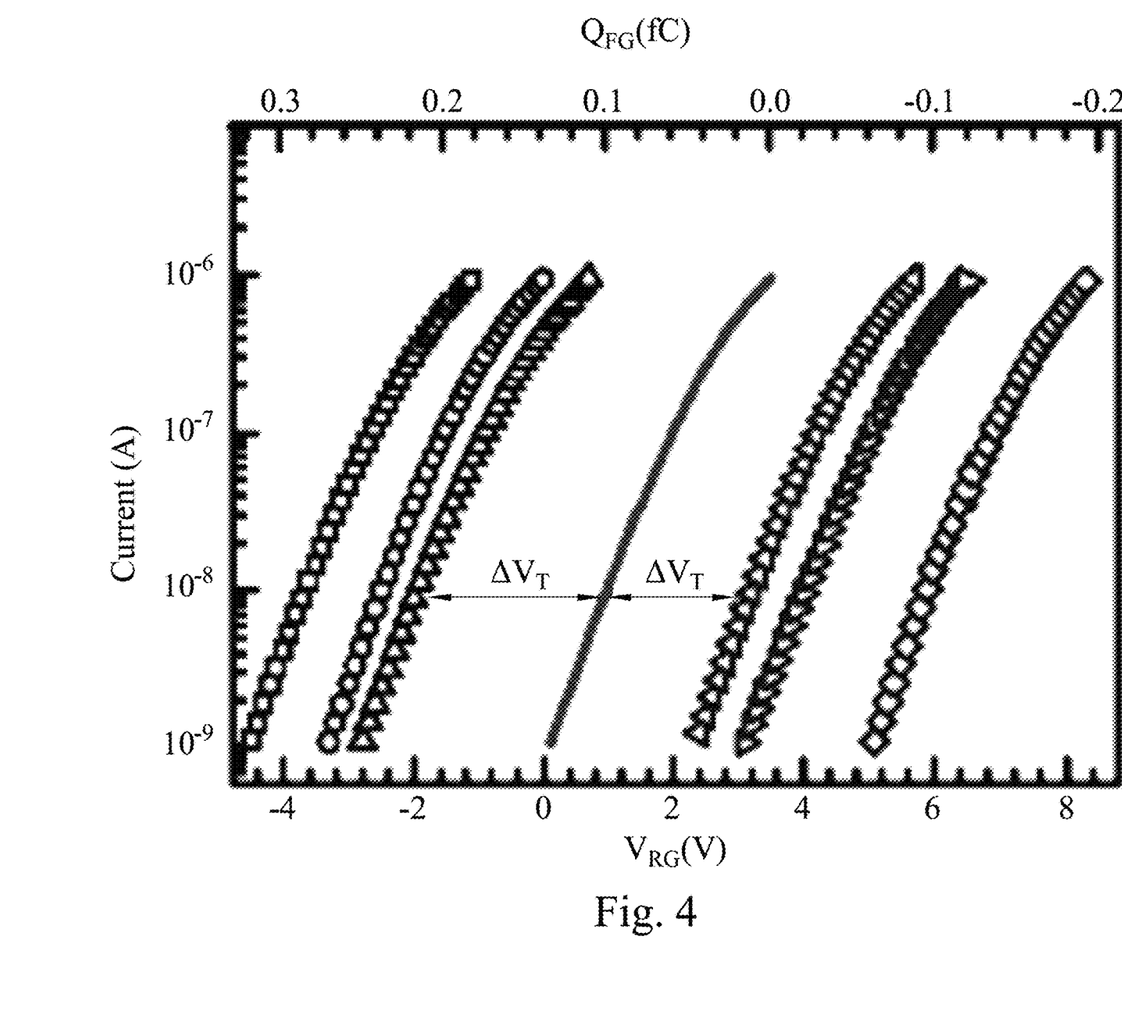
FIG. 4 shows a relationship between an induced charge and an offset value of a cut-off voltage.

FIG. 4 shows a relationship between an induced current and an offset value $\Delta V_T$ of a cut-off voltage. $V_{RG}$ represents a measured voltage value through the reading gate 150. In FIG. 4, it is clearly shown that the value of the cut-off voltage has an offset when the induced charge generated. Furthermore, the value of the induced charge $Q_{FG}$ can be a positive value or a negative value, therefore the offset value $\Delta V_T$ of the cut-off voltage can also be a positive value or a negative value.

Figure 5:
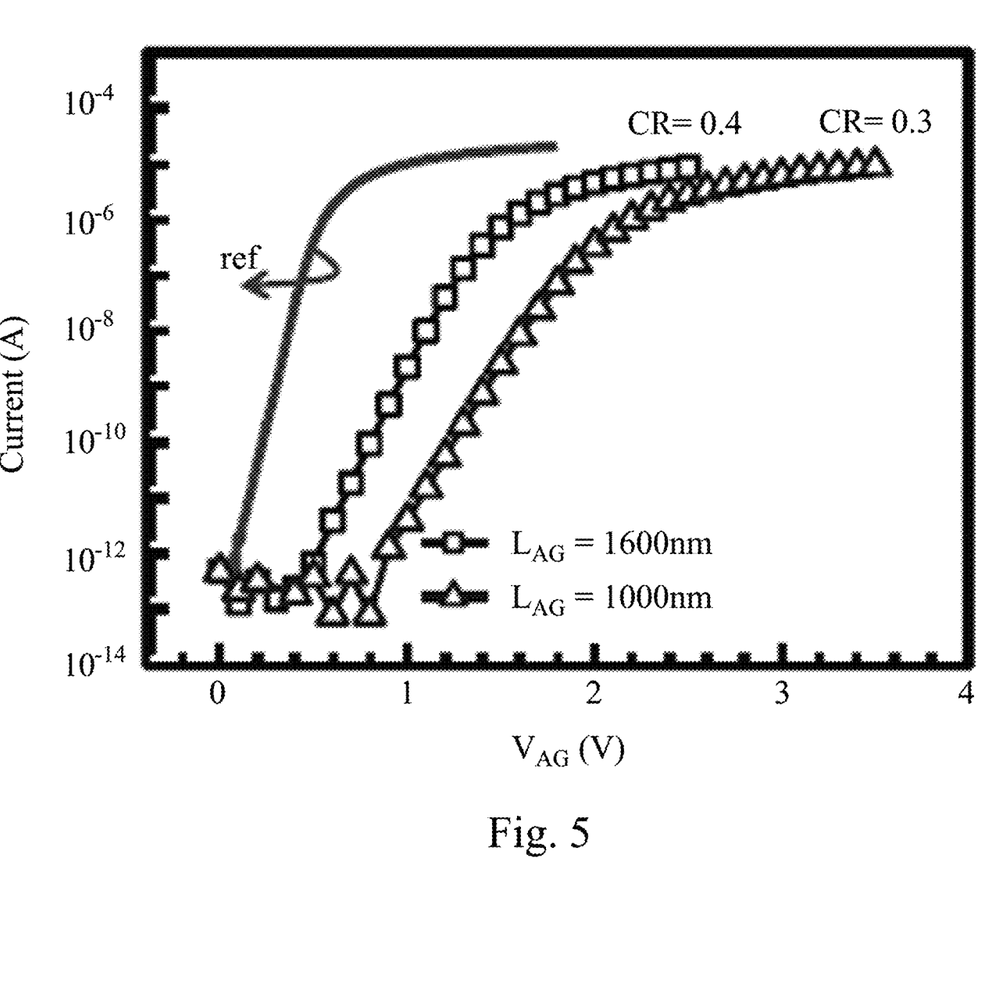
FIG. 5 shows a coupling ratio varied with a length of a sensing gate.

FIG. 5 shows a coupling ratio CR varied with a length LAG of a sensing gate 140. $V_{AG}$ represents a measured voltage value measured through the sensing gate 140. In FIG. 5, it is clearly shown that when the length LAG of the sensing gate 140 increases 1.6 times, the coupling ratio CR also increases 7%. In other word, the coupling ratio CR can be controlled through controlling the length LAG of the sensing gate 140.

Figure 6A:
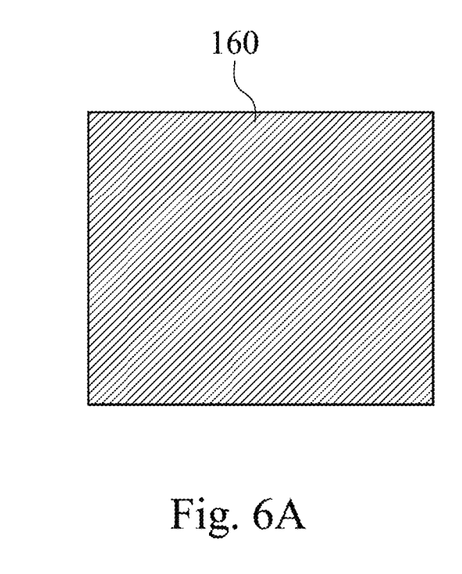
FIGS. 6A, 6B and 6C are schematic views showing various structures of an energy sensing film of the micro detector of FIG. 2.
Figure 6B:
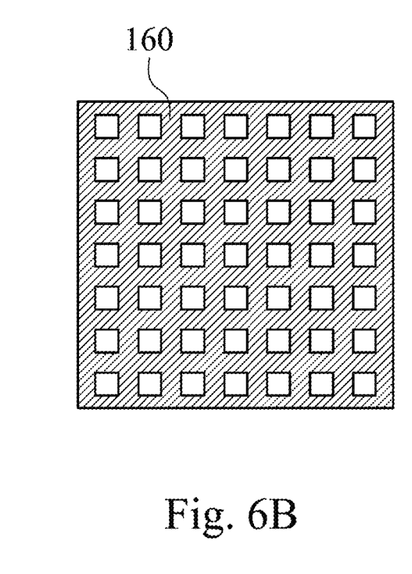
Figure 6C:
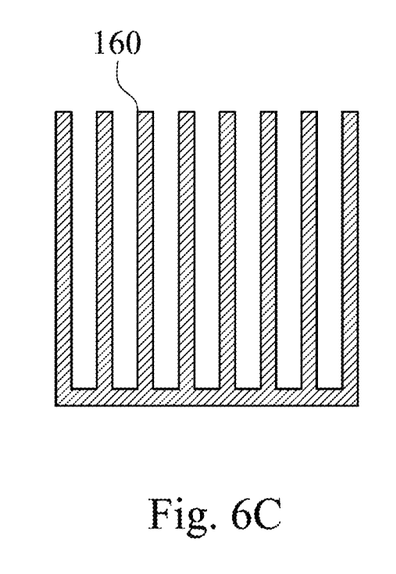

FIGS. 6A, 6B and 6C are schematic views showing various structures of the energy sensing film 160 of the micro detector 100 of FIG. 2. In FIG. 6A, the energy sensing film 160 has a shape of a flat; in FIG. 6B, the energy sensing film 160 has a shape of a palisade and in FIG. 6C, the energy sensing film 160 has a shape of a fork. Different shapes of the energy sensing film 160 can generate different coupling effects between the external energy source and the energy sensing film 160. The energy sensing film 160 can be made of a metal or a photosensitive material, such as Ge, InGaAs, GaP, Si, etc.

Figure 7:
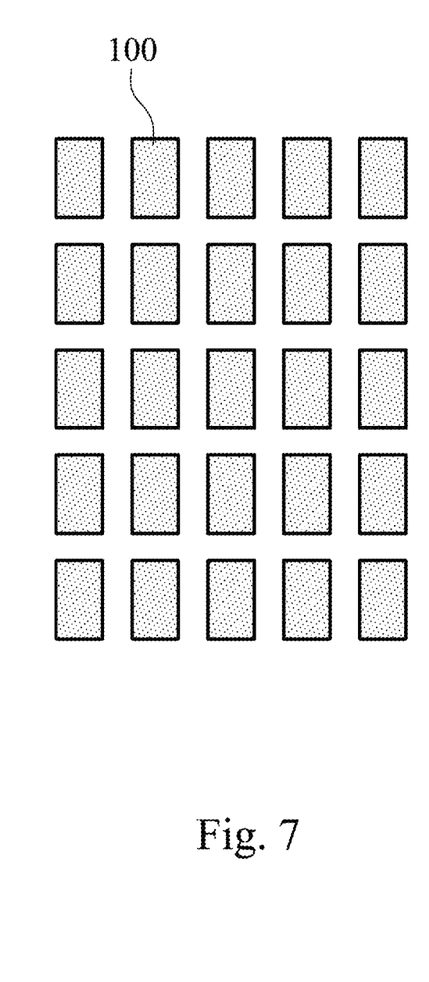
FIG. 7 is a schematic view showing a structure of a micro detector array according to one embodiment of the present disclosure.

FIG. 7 is a schematic view showing a structure of a micro detector 100 array according to one embodiment of the present disclosure. The micro detector 100 can be ranged to form a micro detector 100 array. Therefore, a defect distribution of a whole wafer can be obtained by the micro detector 100 array.

Figure 8:
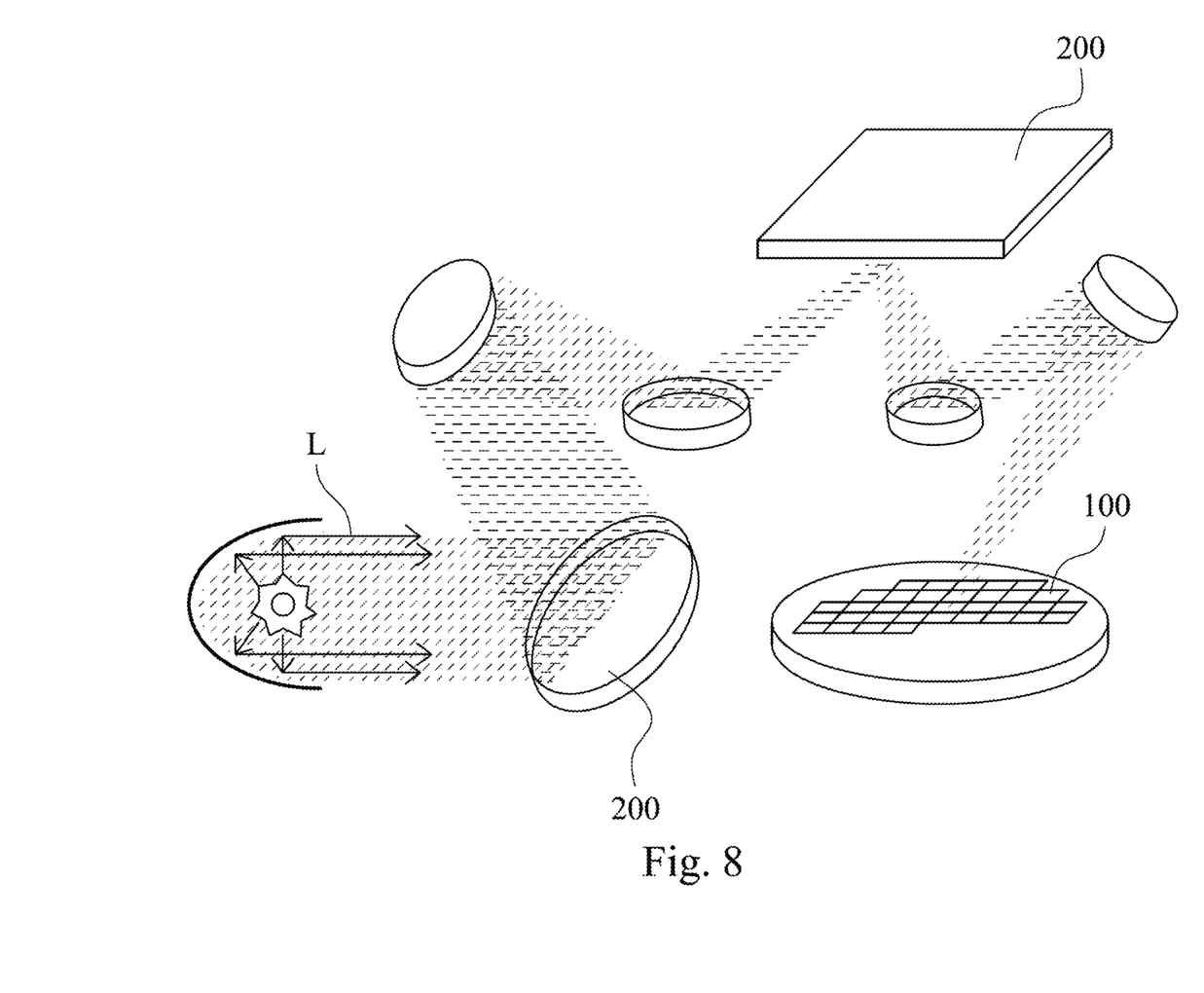
FIG. 8 is a schematic view showing an application of the micro detector array of FIG. 7.

FIG. 8 is a schematic view showing an application of the micro detector 100 array of FIG. 7. The micro detector 100 array can be formed through a 7 nm advanced process and is used to perform a detection and a measurement in a EUV light lithography system. A EUV light source L passed through a plurality of optical components 200 is irradiated to a wafer and is reacted with a photoresist for generating required patterns. An epitaxial growth process and an etching process are also used for forming the required semiconductor device. The micro detector 100 array can store the inducted charge of the EUV light, and an electrical measurement can be performed in an inter-metal layer, thereby obtaining detecting result of the flare effect of the EUV light during each step of the manufacturing process. Therefore, the reliability of the EUV light lithography system can be enhanced, and the EUV light lithography system can also be optimized.

Figure 9A:
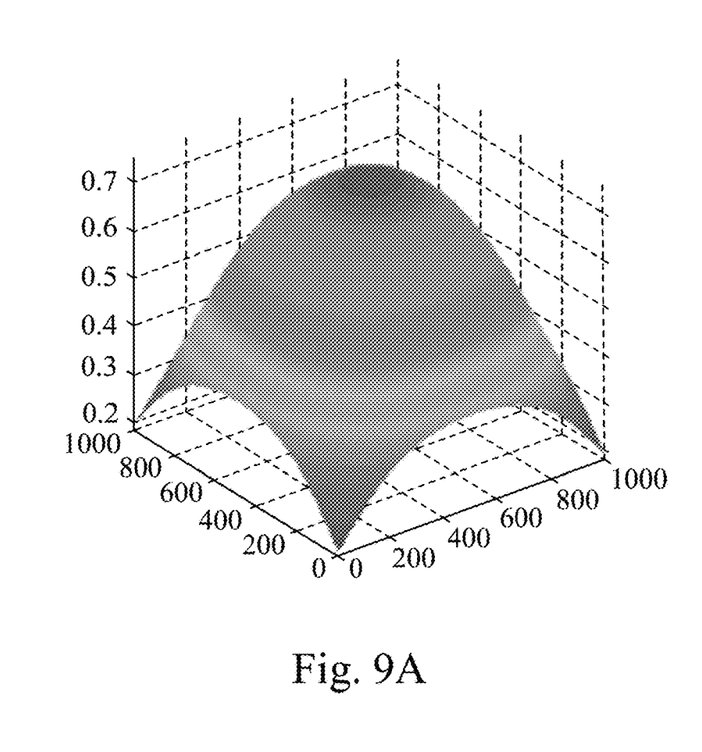
FIGS. 9A and 9B are schematic views showing different levels of a flare effect of a EUV (Extreme Ultraviolet) light.
Figure 9B:
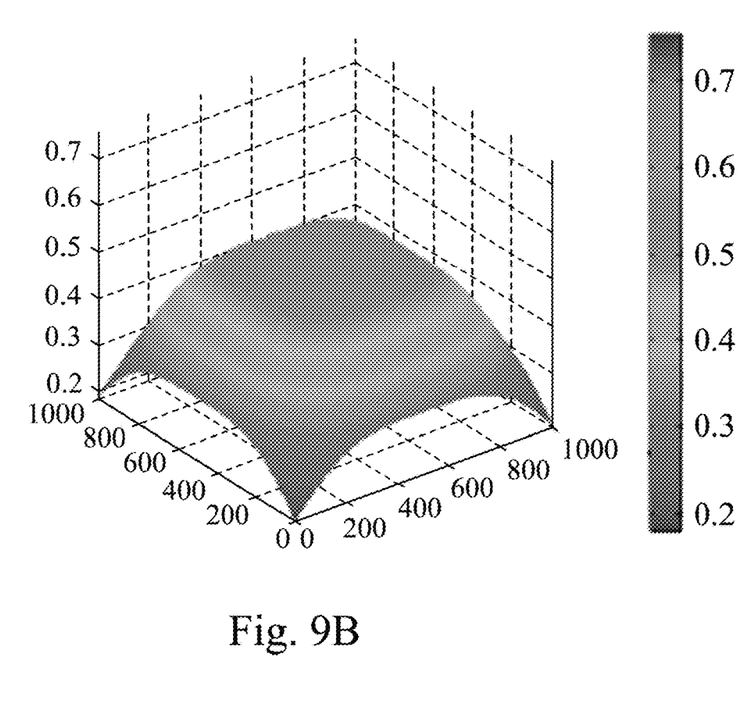
Figure 10A:
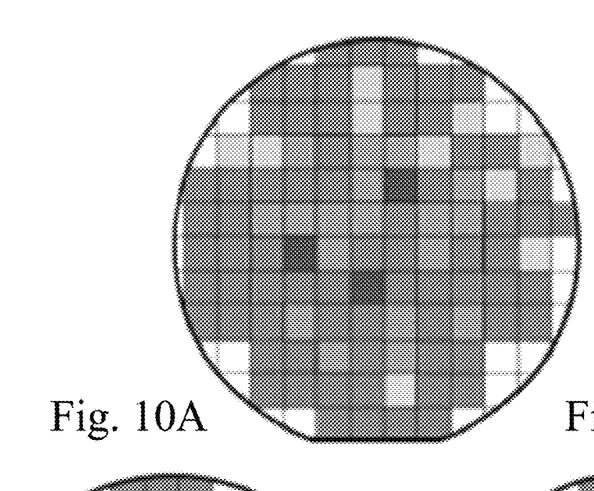
FIGS. 10A, 10B, 10C, 10D and 10E show an induced charge varied with different layers of the energy sensing film during a plasma-assisted photolithography process.
Figure 10B:
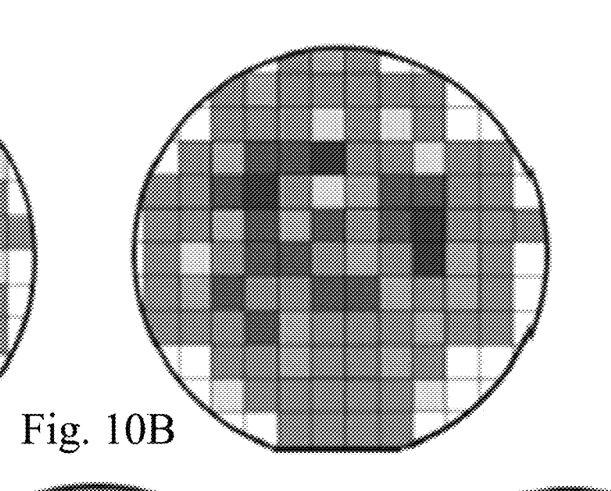
Figure 10C:
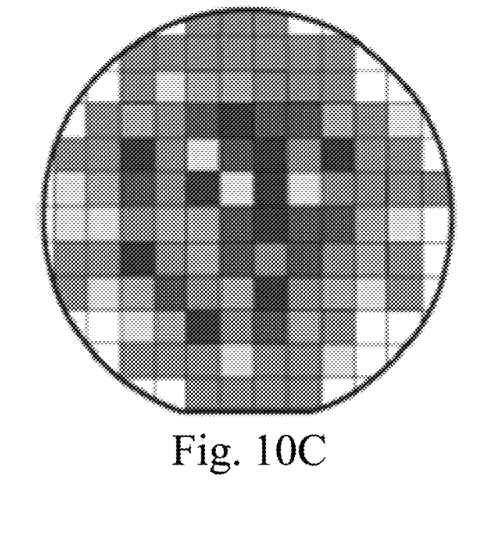
Figure 10D:
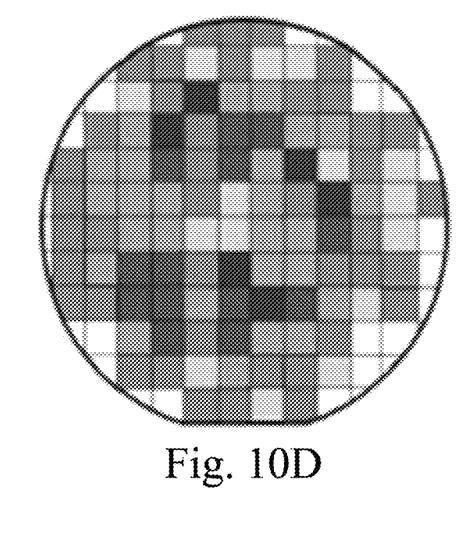
Figure 10E:
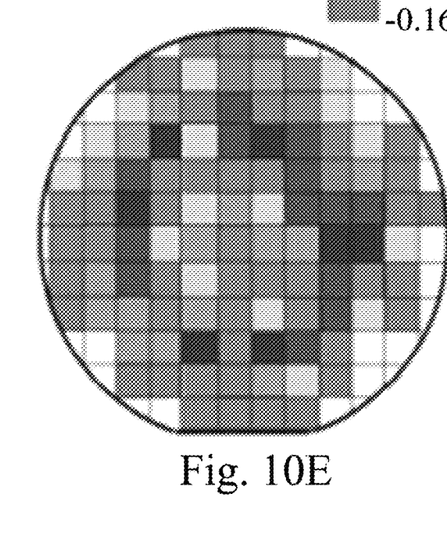

FIGS. 9A and 9B are schematic views showing different levels of a flare effect of a EUV light. A relationship between the flare effect and the cut-off voltage has been studied. For example, in FIG. 9A, the flare effect is more significant, and a height difference between a middle region and an edge portion of a distribution of the cut-off ($V_T$) is also more significant. In contrast, in FIG. 9B, the flare effect is less significant, therefore the height difference between the middle portion and the edge portion of the distribution of the cut-off voltage is less significant. Accordingly, through the micro detector 100 and the defect measurement method of the present disclosure, the cut-off voltage $V_T$ can be obtained through a measured I-V curve, and the charges in the floating gate 130 can be calculated using the value of the cut-off voltage. The value of the charges can be used to calculate a tunneling current density and an electric field of an oxide layer. A voltage induced by the EUV light can be calculated by dividing the tunneling current density and the electric field of the oxide layer by the coupling ratio of the energy sensing film 160. Finally, the intensity of the EUV light can be obtained by calculating a quantum efficiency of a photoelectric effect of the material. Therefore, the levels of the flare effect can be estimated, and the flare effect can be reduced in advanced while the next manufacturing step is performed.

Please refer to FIGS. 10A to 10E. FIGS. 10A, 10B, 10C, 10D and 10E show an induced charge varied with different quantity of the layer of the energy sensing film 160 during a plasma-assisted photolithography process. In the present disclosure, a distribution of the value of the induced charge ($Q_{FG}$) on a wafer can be analyzed through measuring a distribution of the cut-off voltage. When the voltage at the energy sensing film 160 is greater, the absolute value of the cut-off voltage is greater; in contrast, when the voltage at the energy sensing film 160 is smaller, the absolute value of the cut-off voltage is smaller. The distribution of the induced charge can be varied with different manufacturing parameters of the energy sensing film 160. In the FIGS. 10A, 10B, 10C, 10D and 10E, the energy sensing film 160 has one layer, two layers, three layers, four layers and five layers respectively. Therefore, a concentric circle distribution of the value of the induced charge can be observed.

Figure 11:
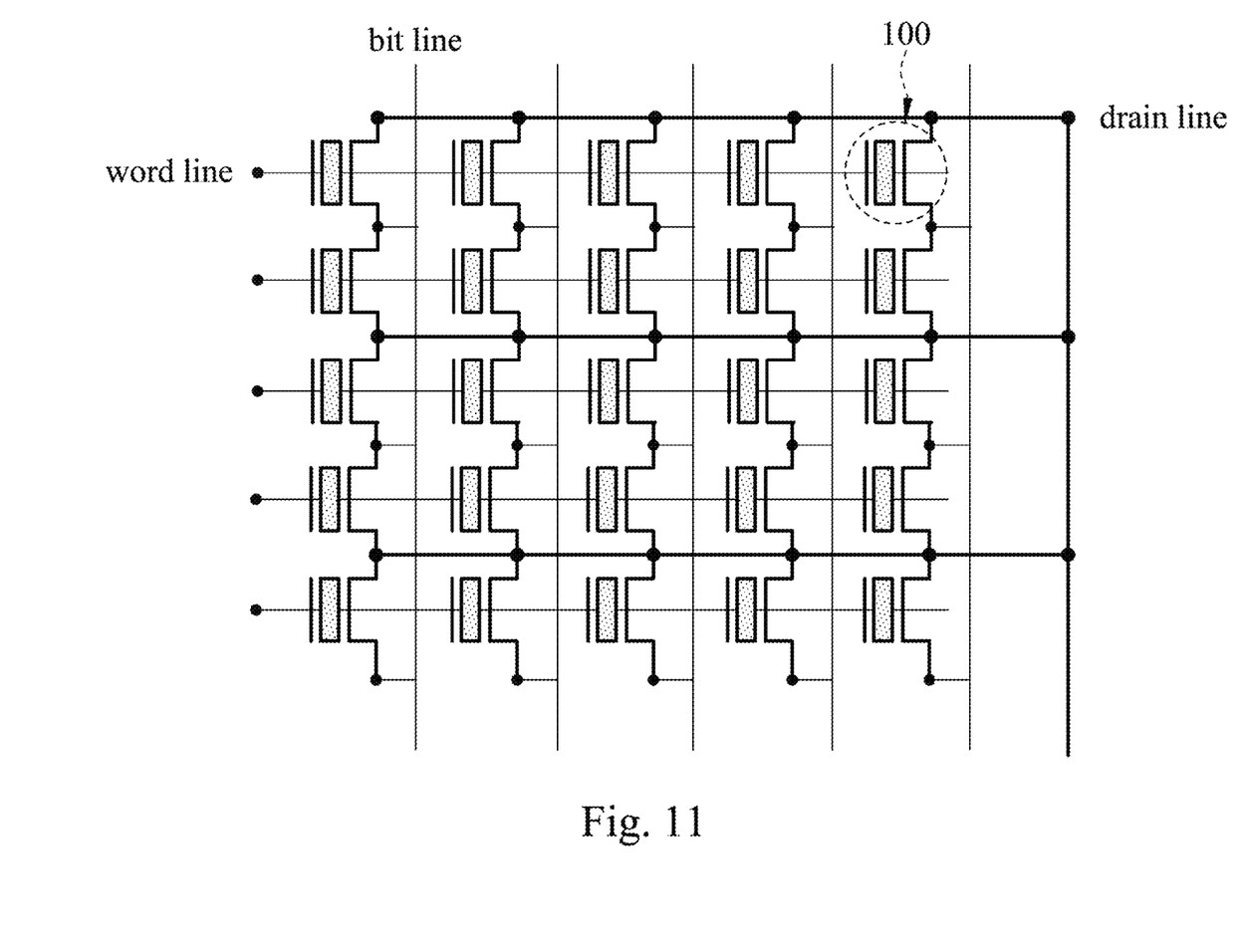
FIG. 11 is a schematic view showing a NOR memory chip architecture formed by using the micro detector of the present disclosure.
Figure 12:
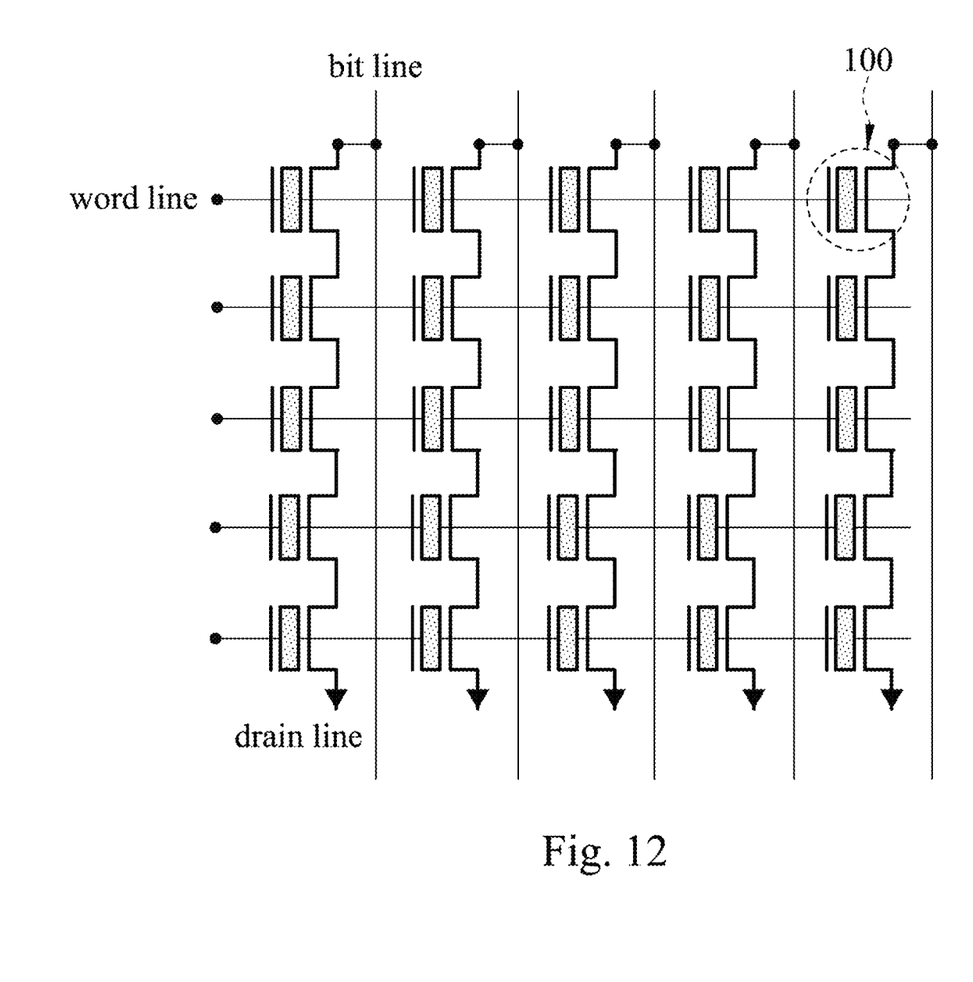
FIG. 12 is a schematic view showing a NAND memory chip architecture formed by using the micro detector of the present disclosure.

Please refer to FIG. 11 and FIG. 12. FIG. 11 is a schematic view showing a NOR memory chip architecture formed by using the micro detector 100 of the present disclosure. FIG. 12 is a schematic view showing a NAND memory chip architecture formed by using the micro detector 100 of the present disclosure. In the NOR memory chip architecture, each memory cell is formed by each micro detector 100, and a plurality of memory cells are connected in parallel for providing a capability of random access. The arrangement of a word line, a bit line and a drain line is shown at FIG. 11. The NOR memory chip architecture can provide a low density and a high reading speed. In the NAND memory chip architecture, each memory cell is also formed by each micro detector 100, and a plurality of memory cells are connected in parallel. However, in FIG. 12, it is shown that the NAND memory chip architecture has smaller cell size, therefore the volume thereof is more compact, and the cost per cell is also lower. The arrangement of a word line, a bit line and a drain line is shown at FIG. 12. In a conventional NAND or NOR memory chip architecture, the word line is directly connected to the gate. In the present disclosure, the word line of the micro detector 100 is connected to the reading gate 150 for detecting signals through a coupling effect. Furthermore, in the conventional NAND or NOR memory chip architecture, there are no structures such as the fin structure 120 and the sensing gate 140 and the reading gate 150 located at two sides of the fin structure 120 as in the micro detector 100 of the present disclosure. Therefore, the micro detector 100 of the present disclosure can detect defects instantly and has wide application range.

Accordingly, the micro detector 100 array of the present disclosure can detect the induced charge generated during the EUV light lithography process through an electrical measurement method. The electrical measurement method can completely replace the conventional optical method that using CCD or SEM to observe the patterns. Due to the defect measurement method of the present disclosure can be easily performed; it can be used in a WAT (Wafer Acceptance Test) of an in-line wafer manufacturing process and can be a reference of a next manufacture step. Furthermore, the micro detector 100 array can be used to store induced charge, and an electrical measurement can be used to estimate a distribution region of the flare effect. A quantitative analysis can also be performed for providing a reference of a reliability of the EUV light lithography system. Furthermore, the layout of the mask can be designed to estimate flare effect between multiple metal layers in a BEOL (Back End of Line), and the electrical measurement can be performed in an inter-metal layer during a wafer manufacturing process. Therefore, the flare effect of the EUV light can be estimated in each step of the wafer manufacturing process, thus the EUV light lithography process can be optimized and the reliability thereof can be enhanced.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A defect measurement method, which is applied to at least one micro detector, wherein the micro detector comprises a substrate, a fin structure located on the substrate, a floating gate located on the substrate and a coupling structure coupled with the floating gate, the fin structure comprises a drain and a source formed at two ends thereof, the micro detector forms a fin transistor structure, and the defect measurement method comprises:

dividing the coupling structure into a charge collecting region and a signal reading region;
forming a sensing gate in the charge collecting region;
connecting the sensing gate to an energy sensing film via a connecting contact;
forming a reading gate in the signal reading region, wherein the energy sensing film is a single piece and comprises an open end that is spaced apart from the reading gate in a vertical direction, the vertical direction is substantially along a direction normal to an upper surface of the energy sensing film, the connecting contact has a length along the vertical direction, and the connecting contact extends between the energy sensing film and the sensing gate and interconnects the energy sensing film and the sensing gate;
generating an induced charge by contacting the energy sensing film with an external energy source;
generating a coupling effect through the coupling structure and storing the induced charge in the floating gate;
performing a voltage measurement through the reading gate of the micro detector for obtaining a cut-off voltage of the micro detector;
comparing the cut-off voltage with a reference voltage for obtaining an offset value of the cut-off voltage; and
calculating a value of the induced charge using the offset value of the cut-off voltage.

2. The defect measurement method of claim 1, wherein the external energy source is an electromagnetic wave, an electron beam, a plasma or an ion beam.

3. The defect measurement method of claim 2, wherein the electromagnetic wave comprises an ultraviolet light, a violet light, an extreme ultraviolet light, a visible light or an infrared light.

4. The defect measurement method of claim 1, wherein the value of the induced charge can be represented by the following equation:

$$Q_{FG} = C_T \times \Delta V_T \times CR_{READ};$$

wherein $Q_{FG}$ is the value of the induced charge, $C_T$ is a total capacitance of the floating gate, $\Delta V_T$ is the offset value of the cut-off voltage and $CR_{READ}$ is a couple ratio of the reading gate.

5. The defect measurement method of claim 1, wherein when the defect measurement method is applied to a plurality of micro detectors, the micro detectors are arranged to form a micro detector array.

6. The defect measurement method of claim 5, wherein the micro detectors construct a NAND memory chip architecture or a NOR memory chip architecture.

* * * * *